United States Patent
Sanchez et al.

(10) Patent No.: US 8,309,440 B2
(45) Date of Patent: Nov. 13, 2012

(54) METHOD AND APPARATUS FOR CLEANING A SUBSTRATE SURFACE

(75) Inventors: Errol Antonio C. Sanchez, Tracy, CA (US); Johanes Swenberg, Los Gatos, CA (US); David K. Carlson, San Jose, CA (US); Roisin L. Doherty, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/175,446

(22) Filed: Jul. 1, 2011

(65) Prior Publication Data

US 2011/0263103 A1    Oct. 27, 2011

Related U.S. Application Data

(63) Continuation of application No. 12/146,177, filed on Jun. 25, 2008, now Pat. No. 8,008,166.

(60) Provisional application No. 60/952,230, filed on Jul. 26, 2007.

(51) Int. Cl.
*H01L 21/20* (2006.01)

(52) U.S. Cl. ........ 438/478; 438/770; 438/787; 438/689; 438/976; 257/E21.09

(58) Field of Classification Search .................. 438/478, 438/770, 787, 976, 689; 257/E21.09
See application file for complete search history.

(56) References Cited

U.S. PATENT DOCUMENTS

| | | | |
|---|---|---|---|
| 6,042,687 A | 3/2000 | Singh et al. | |
| 6,059,887 A | 5/2000 | Muraoka et al. | |
| 6,083,323 A | 7/2000 | Carlson et al. | |
| 6,109,206 A | 8/2000 | Maydan et al. | |
| 6,204,120 B1 | 3/2001 | Gilboa et al. | |
| 6,207,005 B1 | 3/2001 | Henley et al. | |
| 6,376,387 B2 | 4/2002 | Carlson et al. | |
| 6,455,814 B1 | 9/2002 | Samoilov et al. | |
| 6,478,924 B1 | 11/2002 | Shamouilian et al. | |
| 6,494,959 B1 | 12/2002 | Samoilov et al. | |
| 6,514,886 B1 | 2/2003 | U'Ren | |
| 6,660,659 B1 | 12/2003 | Kraus et al. | |
| 6,685,779 B2 | 2/2004 | Carlson et al. | |
| 6,833,322 B2 | 12/2004 | Anderson et al. | |

(Continued)

FOREIGN PATENT DOCUMENTS

| | | |
|---|---|---|
| CN | 101005031 A | 7/2007 |
| JP | S62-149117 | 7/1987 |
| TW | 401586 | 8/2000 |

OTHER PUBLICATIONS

Search Report dated Nov. 2, 2011 for Taiwan Invention Patent Application No. 097127662.

(Continued)

*Primary Examiner* — Jack Chen
(74) *Attorney, Agent, or Firm* — Patterson & Sheridan, LLP

(57) ABSTRACT

Embodiments described herein provide methods for processing a substrate. One embodiment comprises positioning a substrate in a processing region of a processing chamber, exposing a surface of the substrate disposed in the processing chamber to an oxygen containing gas to form a first oxygen containing layer on the surface, removing at least a portion of the first oxygen containing layer to expose at least a portion of the surface of the substrate, and exposing the surface of the substrate to an oxygen containing gas to form a second oxygen containing layer on the surface.

20 Claims, 6 Drawing Sheets

U.S. PATENT DOCUMENTS

| | | |
|---|---|---|
| 6,878,636 B2 | 4/2005 | Bailey et al. |
| 6,878,639 B1 | 4/2005 | Tsai et al. |
| 7,105,449 B1 | 9/2006 | Nozawa et al. |
| 7,132,372 B2 | 11/2006 | Smith et al. |
| 7,141,514 B2 | 11/2006 | Chua |
| 2006/0057810 A1 | 3/2006 | Smith et al. |
| 2006/0105114 A1 | 5/2006 | White |
| 2006/0175613 A1 | 8/2006 | Lee et al. |
| 2006/0178018 A1 | 8/2006 | Olsen |
| 2006/0223315 A1 | 10/2006 | Yokota et al. |
| 2006/0258124 A1 | 11/2006 | Singh et al. |
| 2007/0026693 A1 | 2/2007 | Yokota et al. |
| 2009/0029528 A1 | 1/2009 | Sanchez et al. |
| 2011/0263103 A1 * | 10/2011 | Sanchez et al. ............... 438/478 |

OTHER PUBLICATIONS

Official Letter dated May 25, 2011, from Chinese Patent Office for corresponding Chinese Patent Application No. 200880100583.8.

PCT International Search Report and Written Opinion dated Sep. 26, 2008 for International Application No. PCT/US2008/69430. cited by other.

Prosecution history of U.S. Appl. No. 12/146,177 as of Sep. 6, 2011.

Notice of Rejection dated Apr. 11, 2012 for Japanese Patent Application No. 2010-518270.

PCT International Search Report and Written Opinion dated Sep. 26, 2008 for International Application No. PCT/US2008/69430.

* cited by examiner

METHOD AND APPARATUS FOR CLEANING A SUBSTRATE SURFACE

CROSS-REFERENCE TO RELATED APPLICATIONS

This application is a continuation of U.S. patent application Ser. No. 12/146,177, filed Jun. 25, 2008, which claims the benefit of the U.S. Provisional Patent Application Ser. No. 60/952,230, filed Jul. 26, 2007, both of which are herein incorporated by reference.

BACKGROUND OF THE INVENTION

1. Field of the Invention

Embodiments of the present invention generally relate to method and apparatus for processing a semiconductor substrate. More particularly, embodiments of the present invention relate to method and apparatus for cleaning a surface of a silicon substrate.

2. Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical ambient conditions. Therefore, a substrate needs to be cleaned to remove impurities and particles found on silicon wafer surface prior to performing various semiconductor processes, such as the formation of an epitaxial layer.

Conventionally, semiconductor substrates are cleaned using wet cleaning processes or conventional plasma cleaning process. However, wet cleaning processes have "queue time" issues, which can cause wafer to wafer variation in wafer lots due to varying idle times for different wafers in a lot. Conventional remote or in-situ plasma cleaning processes can be very challenging due to the contamination of the chamber and substrates processed in the chamber due to the creation of unwanted species that are formed in the gas phase or during the cleaning process. These unwanted species either limit the cleaning action of the desired species or introduce other complications to the cleaning process.

Therefore, there is a need for method and apparatus for cleaning a substrate surface, especially for cleaning a substrate surface prior to performing an epitaxial deposition process.

SUMMARY OF THE INVENTION

Embodiments described herein provide methods for processing a semiconductor substrate. One embodiment comprises positioning a substrate in a processing region of a processing chamber, exposing a surface of the substrate disposed in the processing chamber to an oxygen containing gas to form a first oxygen containing layer on the surface, removing at least a portion of the first oxygen containing layer to expose at least a portion of the surface of the substrate, and exposing the surface of the substrate to an oxygen containing gas to form a second oxygen containing layer on the surface.

In another embodiment, a method for processing a semiconductor substrate is provided. The method includes positioning a substrate in a processing region of a processing chamber, exposing a surface of the substrate disposed in the processing chamber to an oxygen containing gas to form a first oxygen containing layer on the surface, removing at least a portion of the first oxygen containing layer to expose at least a portion of the surface of the substrate, and exposing the surface of the substrate to an oxygen containing gas to form a second oxygen containing layer on the surface, wherein forming the first oxygen containing layer, removing at least the portion of the first oxygen containing layer and forming the second oxygen containing layer are all performed in the processing chamber.

In another embodiment, a method for processing a semiconductor substrate is provided. The method includes positioning a substrate in a processing region of a processing chamber, oxidizing a surface of the substrate disposed in the processing chamber by exposing the surface of the substrate to an oxygen containing gas to form a first oxidized layer on the substrate, removing at least a portion of the first oxidized layer to expose at least a portion of the surface of the substrate, and re-oxidizing the exposed surface of the substrate to form a second oxidized layer on the surface of the substrate, wherein forming the first oxidized layer, removing at least the portion of the first oxidized layer and re-oxidizing the exposed surface are all performed in the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and method for forming a clean and damage free surface on a semiconductor substrate (or wafer). One embodiment of the present invention provides a system that contains a cleaning chamber that is adapted to expose a surface of substrate to a plasma cleaning process prior to forming an epitaxial layer thereon. In one embodiment, a method is employed to reduce the contamination of a substrate processed in the cleaning chamber by depositing a gettering material on the inner surfaces of the cleaning chamber prior to performing a cleaning process on a substrate. The gettering material will tend to trap contaminants found in the cleaning chamber, thus insuring that the processed substrate is clean, and future substrates processed in the chamber will have the same desirable cleaning results. In one embodiment, oxidation and etching steps are repeatedly performed on a substrate in the cleaning chamber to expose or create a clean surface on a substrate that can then have an epitaxial film placed thereon. In one embodiment, a low energy plasma is used during the etching step. The low energy of the plasma may be achieved by lowering the substrate RF bias power, adjusting bias potential applied across the substrate, pulsing the RF power used to generate a plasma in the processing chamber, pulsing substrate RF bias power, forming a plasma that contains light atomic species, using a plasma shield to confine the plasma, adjusting processing position of the substrate relative to the plasma, and/or a combination thereof.

Cleaning Chamber

Figure 1:
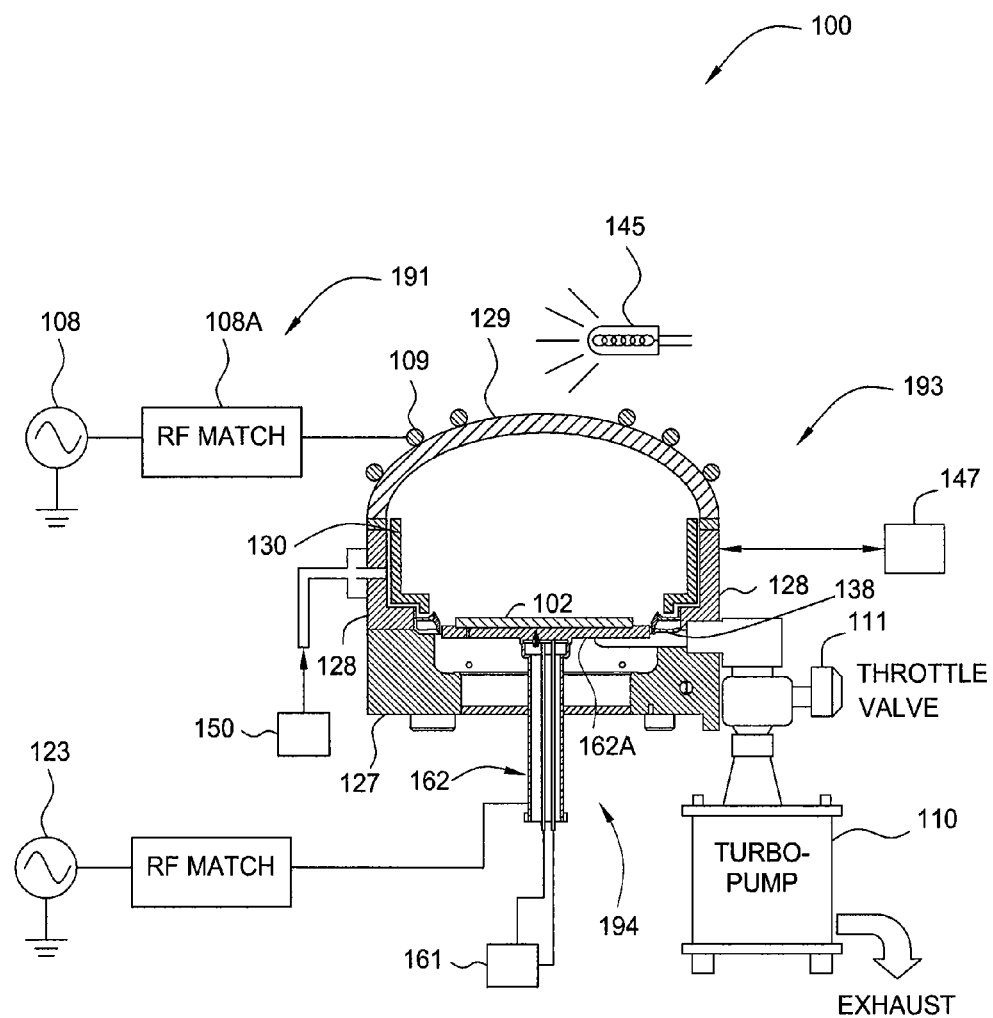
FIG. 1 schematically illustrates a sectional side view of a cleaning chamber in accordance with one embodiment of the present invention.

FIG. 1 schematically illustrates a cross-sectional side view of a cleaning chamber 100 in accordance with one embodiment of the present invention. The cleaning chamber 100 is an inductively coupled plasma processing chamber that is able to clean a substrate 102, in a processing region 122. In one embodiment, the cleaning chamber 100 is a modified Decoupled Plasma Nitridation (DPN) Chamber that is available from Applied Materials of Santa Clara, which uses an inductively coupled radio frequency (RF) source. Detailed description of a DPN chamber may be adapted to perform one or more of the processes described herein can be found in U.S. Pat. No. 6,660,659, entitled "Plasma Method and Apparatus for Processing a Substrate" and U.S. Pat. No. 7,122,454, entitled "Method for improving nitrogen profile in plasma nitrided gate dielectric layers," which are both incorporated herein by reference.

The cleaning chamber 100 generally comprises an RF source assembly 191, a process chamber assembly 193, and a substrate support assembly 194. The process chamber assembly 193 generally comprises multiple components that are used to form a vacuum in the processing region 122 so that a plasma process can be performed therein. In general the process chamber assembly 193 comprises a chamber base 127, chamber walls 128 and a chamber lid 129 that sealably enclose the processing region 122. The processing region 122 can be evacuated to a desired vacuum pressure by the use of a vacuum pump 110 that is connected to the processing region 122 through the chamber base 127 and/or chamber walls 128. Generally, the chamber walls 128 and chamber base 127 may be formed from a metal, such as aluminum, or other suitable material.

In one embodiment, the chamber walls 128 and chamber lid 129 may be temperature controlled. Conventional methods and/or heat exchanging devices may be used to heat and cool various chamber components. For example, the chamber walls 128 and chamber lid 129 may be heated by heaters (not shown), such as lamp arrays, positioned outside the process chamber assembly 193. In another example, cooling gases may be circulated out side the process chamber assembly 193 to cool the chamber walls 128 and chamber lid 129. In another example, heating and/or cooling conduits, which may be embedded in the chamber walls 128 and chamber lid 129, may be connected to a fluid heater/chiller device to control the temperature. A method and apparatus that may be used to control the temperature of the process chamber assembly 193 may be found in the U.S. Pat. No. 6,083,323, entitled "Method for Controlling the Temperature of the Walls of a Reaction Chamber During Processing," which is incorporated herein by reference.

In one embodiment, the RF source assembly 191 is an inductive type RF source that generally contains an RF generator 108 and an RF match circuit 108A that are connected to a coil 109. The coil 109 is positioned adjacent to the chamber lid 129. In one embodiment, the RF generator 108 may operate at between about 0 and about 3000 W at a frequency between about 400 kHz and about 60 MHz. In one example, the RF generator 108 operates at a frequency of 13.56 MHz. In one embodiment, the RF generator 108 may provide pulses of RF energy to the coil 109 to generate a plasma that has a reduced energy level and/or plasma density.

The chamber lid 129 is generally a dielectric component (e.g., quartz, ceramic material (e.g., alumina)) that is adapted to allow the RF energy delivered from the inductive RF source assembly 191 to form a plasma in the processing region 122.

In one embodiment, the process chamber assembly 193 also contains a gas delivery system 150 that is adapted to deliver one or more process gasses into the processing region 122, which is defined by the chamber base 127, the chamber walls 128 and the chamber lid 129. In one embodiment, the processing region 122 is circumscribed with one or more shields 130 that are intended to protect the chamber walls 128 and/or the chamber lid 129 from the generated plasma and preparation processes performed in the chamber. In one embodiment, the gas delivery system 150 comprises an ozonator configured to generate a stream of gas containing high concentration ozone ($O_3$). In one embodiment, the gas delivery system is adapted to deliver a reactive gas, such as a silicon containing gas (e.g., silane), a hydrogen containing gas (e.g., $H_2$), a germanium containing gas, a chlorine containing gas, an oxygen containing gas (e.g., $O_2$), nitrogen trifluoride ($NF_3$), a boron containing gas (e.g., diborane), and/or a phosphorous containing gas (e.g., phosphine) to name just a few. In one embodiment, the gas delivery system is adapted to deliver an inert gas, such as argon (Ar), helium (He), krypton (Kr) and/or nitrogen ($N_2$). The pressure in the processing region 122 can be controlled by adjusting the flow rate of gas delivered by the gas delivery system 150 and the pumping speed of the vacuum pump 110. A throttle valve 111 may be used to adjust the pumping speed of the vacuum pump 110.

The substrate support assembly 194 generally includes a substrate support 162 that contains a substrate supporting member 162A. The substrate supporting member 162A may be a conventional electrostatic chuck that can be used to actively hold the substrate during processing, or comprise a simple substrate support. A temperature controller 161 is generally adapted heat and/or cool the substrate supporting member 162A to a desired temperature by use of temperature controller 161 and a heat exchanging device, such embedded resistive heating elements or fluid cooling channels that are coupled to a conventional heat exchanger (not shown). In one embodiment, the temperature controller 161 is adapted to operate and heat a substrate 102 positioned on the substrate supporting member 162A to a temperature between about 20° C. and about 800° C.

During processing the substrate support 162 may be connected to a RF generator 123 so that an RF bias can be applied to a conductive element disposed within a portion of the substrate support 162 to pull the ions present in the plasma formed in the processing region 122 to a surface of the substrate 102. In one embodiment, the RF generator 123 is adapted to generate a cathodic or anodic bias on the substrate during one or more portions of the substrate cleaning process to adjust the retained charge on the substrate and/or control the amount of ion and plasma bombardment of the substrate surface. In one embodiment, the substrate supporting member 162A is grounded, or DC (direct current) biased. In another embodiment, the substrate supporting member 162A and substrate are electrically floating during the plasma process in order to minimize ion bombardment damage of substrate 102.

Referring to FIG. 1, delivering RF energy from the RF generator 108 to the processing region 122 causes the gas atoms in the processing region 122 to become ionized. When the substrate is exposed to plasma generated in the processing region 122 during the cleaning process, contamination on the surface of the substrate 102 may be knocked off or desorbed from the surface due to the energy transferred by the ionized atoms in the plasma striking the surface of the substrate 102. In one embodiment, the ionized gas atoms in the plasma may be attracted to surface of the substrate 102 due to a bias applied to the substrate 102 via the substrate supporting member 162A.

In one embodiment, the RF power delivered to the coil 109 by the RF generator 108 is pulsed to form a low energy plasma. In one embodiment, a pulsed plasma process is generally a series of sequential energy pulses delivered to the processing region 122 as a function of time by use of the coil 109 by the RF generator 108. Pulsing an inductive RF source to excite a plasma formed in the processing region 122 will minimize the amount of damage caused to the surface of the substrate due to the plasma potentials commonly formed in conventional plasma processing chambers. The need to minimize or eliminate any damage caused to the substrate surface by the cleaning process is critical for single crystal substrates that are being prepared for the formation of an epitaxial layer thereon. Damage to the surface of the substrate needs to be minimized to reduce the number of defects and stress in the formed epitaxial layer. Therefore, pulsing the inductive RF source power allows one to create and sustain a low electron temperature, and a low ion energy plasma. Generally, the ions generated by a pulsed RF inductive plasma, which produces ions with low ion energies (e.g., <10 eV) that will not damage a substrate positioned within the plasma. An example of a method of pulsing RF power that can be adapted to benefit one or more of the embodiments described herein is further discussed in the commonly assigned U.S. Pat. No. 6,831,021, filed Jun. 12, 2003, which is incorporated herein by reference.

Figure 2A:
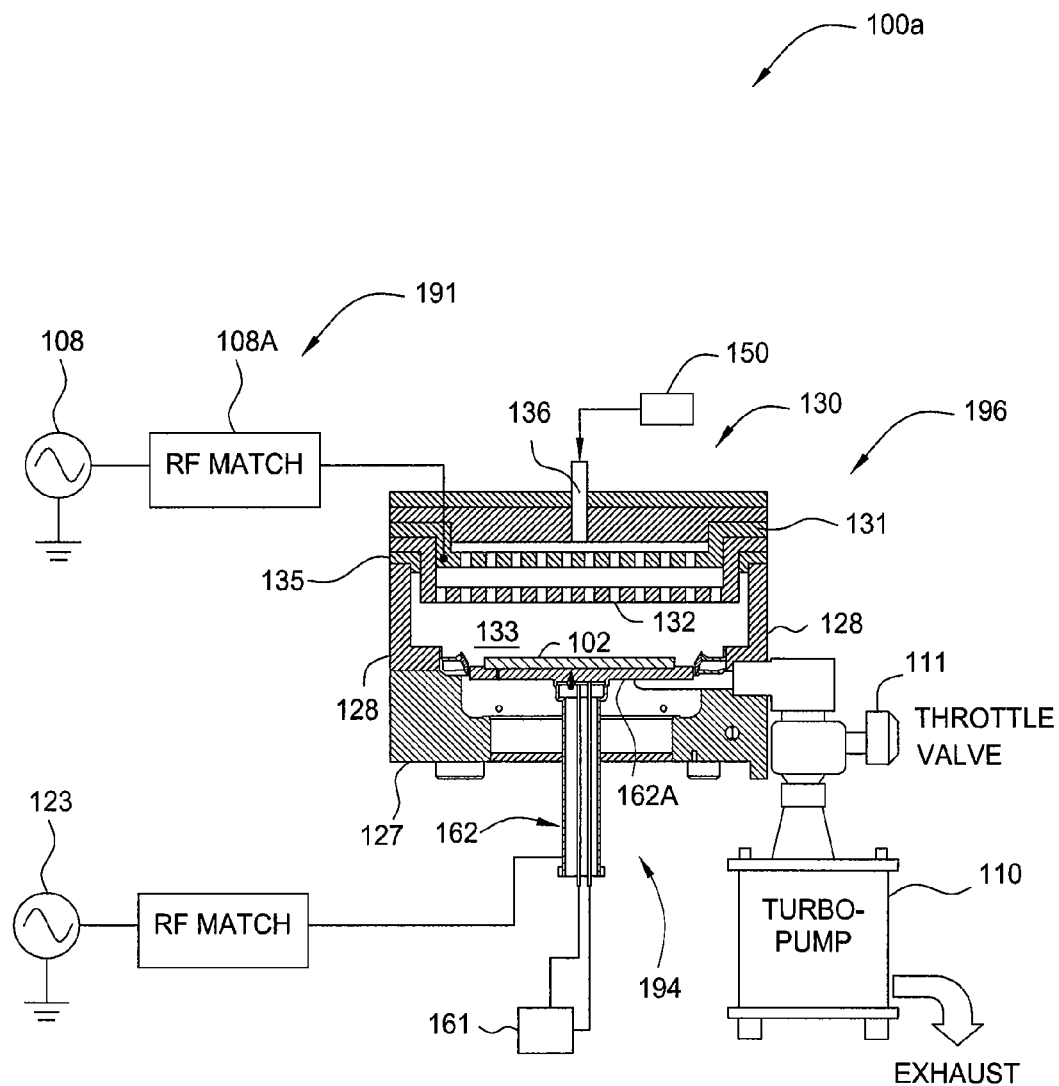
FIG. 2A schematically illustrates a sectional side view of a cleaning chamber in accordance with another embodiment of the present invention.

FIG. 2A schematically illustrates a cross-sectional side view of a cleaning chamber 100a in accordance with another embodiment of the present invention. The cleaning chamber 100a is a capacitively coupled plasma chamber. The cleaning chamber 100a comprises a chamber lid 129 sealably coupled to the process chamber assembly 196 and defining a process region 133. In this configuration, the chamber lid assembly 130 comprises a gas distribution plate (also known as a shower head) 132 and a base plate 131 having a blocker plate 134 substantially parallel to the gas distribution plate 132. The gas distribution plate 132 is isolated from the chamber walls 128 using an electric insulator 135. The chamber lid assembly 130 is connected to the gas delivery assembly 150. Reactant and/or cleaning gases from the gas delivery system 150 may be flown to the process region 133 through a gas passage 136. The RF source assembly 191 is coupled to the base plate 131 providing RF power source for plasma generation. A RF source for capacitive plasma generation generally comprises a radio frequency (RF) power source, for example, a 13.56 MHz RF generator. During processing, the substrate supporting member 162A may be grounded. The bias potential between the substrate supporting member 162A and the base plate 131 may ignite a plasma in the process region 133. Activated species in the plasma can be used to process the substrate 102. During processing the substrate support 162A may be connected to a RF generator 123 so that an RF bias can be applied to a conductive element disposed in portions of the substrate support member 162A to pull the ions present in the plasma that has been generated in the processing region 122 to a surface of the substrate 102. A more detailed description of a capacitively coupled plasma reactor may be found in U.S. Pat. No. 6,495,233, entitled "Apparatus for distributing gases in a chemical vapor deposition system," which is incorporated by reference herein.

The cleaning chambers 100 and 100a (FIGS. 1 and 2) described above may be used to clean a semiconductor substrate. Particularly, the cleaning chambers 100 and 100a of the present invention may be used to perform a damage free cleaning to a silicon surface.

In another embodiment, a cleaning chamber may use microwave energy source (not shown) to generate a plasma that is used to perform the cleaning process discussed herein.

Method for Cleaning a Substrate Surface

Figure 3:
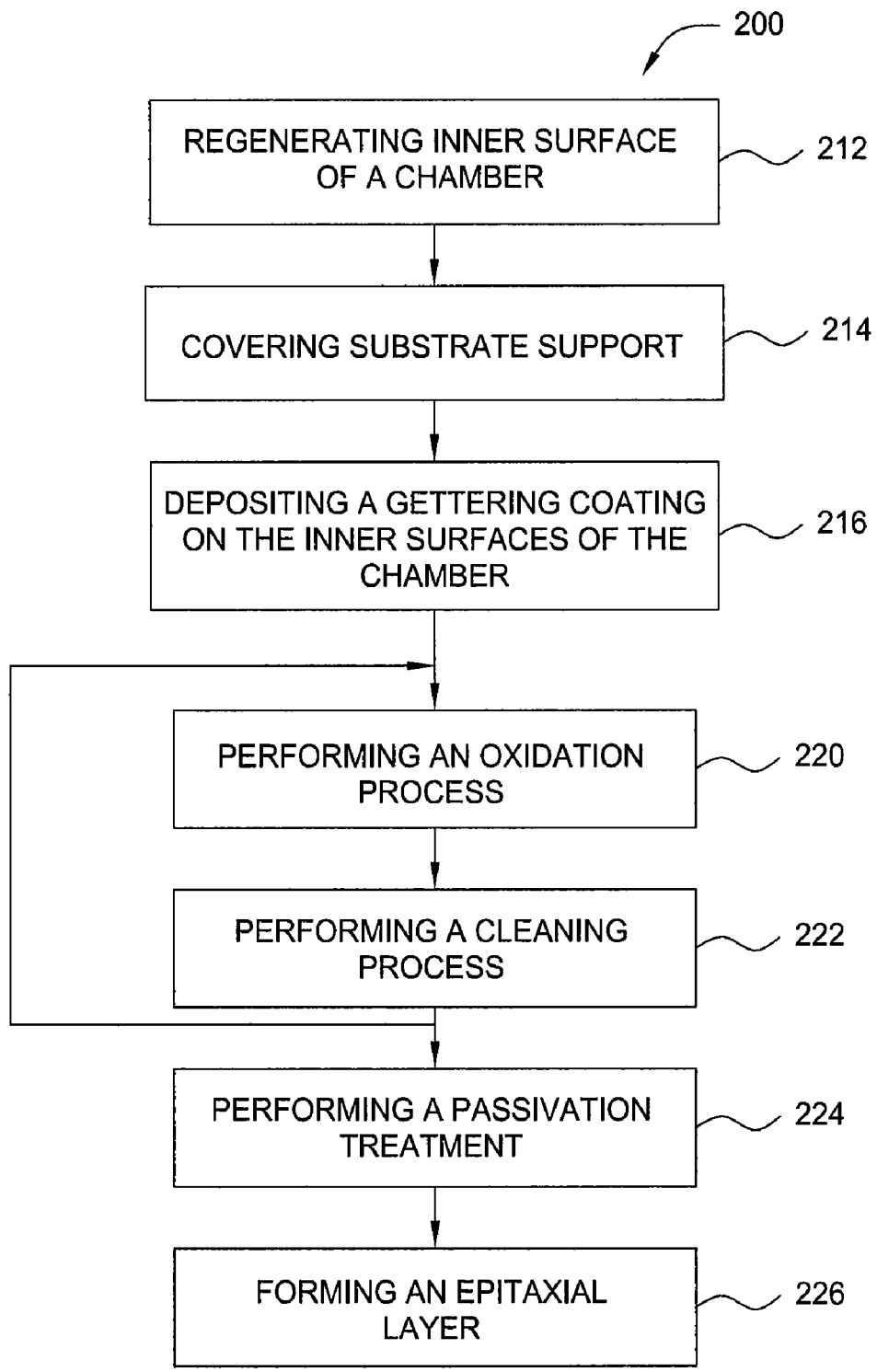
FIG. 3 illustrates a flow chart of a method for cleaning a semiconductor substrate in accordance with one embodiment of the present invention.

FIG. 3 illustrates a flow chart of a method 200 for cleaning a semiconductor substrate in accordance with one embodiment of the present invention. In one embodiment, the method 200 may be performed in the cleaning chambers 100 or 100a described above. In one embodiment, the cleaning process generally provides a method for forming a clean and damage free surface on a semiconductor substrate by use of plasma cleaning process.

In step 212, inner surfaces of a cleaning chamber, such as the cleaning chamber 100 or cleaning chamber 100a, may be regenerated. In one embodiment, step 212 comprises running an etching process to remove any unwanted residual material and/or contamination found on various inner surfaces of the cleaning chamber. Conventional sputter etching and/or chemically assisted etching processes may be performed to regenerate the inner surfaces of the cleaning chamber, such as the chamber walls or shields 130.

In one embodiment, remote or in-situ plasma of a reactive gas may be used to remove contaminations on the inner surface of the cleaning chamber. The reactive gas may be selected from a wide range of gases, including the commonly used halogens and halogen compounds. For example, the reactive gas may be chlorine, fluorine or compounds thereof, such as nitrogen trifluoride ($NF_3$), carbon tetrafluoride ($CF_4$), sulfur hexafluoride ($SF_6$), hexafluoroethane ($C_2F_6$), carbon tetrachloride ($CCl_4$), hexachloroethane ($C_2Cl_6$), or combination thereof depending on the deposited material to be removed.

In one embodiment, a carrier gas, such as argon, nitrogen, helium, hydrogen or oxygen, etc, may be delivered to the processing region of the cleaning chamber to aid the removal of the unwanted species and/or to assist in the etching process, or help initiating and/or stabilizing the plasma in the cleaning chamber.

In one embodiment, a cleaning gas may be delivered into the cleaning chamber to etch a coating comprising a gettering material (discussed below), such as silicon (Si) on the inner surface of the cleaning chamber. The cleaning gas may comprise heated nitrogen trifluoride ($NF_3$), hydrogen chloride (HCl), or the combination thereof. In one embodiment, a conventional remote plasma source (RPS) may be coupled to the processing region of the process chamber. RPS generally provides a reactive cleaning agent, such as disassociated fluorine, that removes deposition and other process byproducts from the chamber components, which is evacuated by the vacuum pump 110.

In step 214, a shutter disk or a dummy substrate may be used to cover a top surface of a substrate support member, such as the substrate supporting member 162A of FIGS. 1 and 2A. The shutter disk or dummy substrate is used to prevent any deposition on the substrate support member during the subsequent deposition, such as step 216, so that a substrate being processed will not be in contact with any coatings formed inside the cleaning chamber. Covering the substrate support member may also avoid chucking problems when the substrate support member is an electrostatic chuck configured to hold the substrate during processing.

In step 216, in one embodiment, one or more of the cleaning chamber components, such as the chamber walls 128, shields 130, shadow rings 138, chamber lid 129 may be conditioned by depositing a gettering coating thereon. The gettering coating may comprise one or more gettering materials. The term gettering materials generally refers to any material that used to immobilize and/or adsorb (i.e., physiosorb, or chemisorb) any impurities found in the cleaning chamber prior to or during the cleaning process. Gettering materials are chosen to remove unwanted byproducts in the cleaning chamber while presenting no other complications, such as generation of new byproducts, generating particles, the unwanted dissipation of RF power, or removal of desired species found in the processing region 122. The thickness of the deposited gettering coating formed during step 216 may be between about 10 Å to about 1 μm. The coating on the inner surfaces may be used to reduce or prevent contamination of subsequently processed substrates. The coating may comprise a pure silicon material (e.g., epitaxial Si layer, polycrystalline Si layer, amorphous Si layer), a silicon containing layer, a germanium containing layer, and/or a silicon or germanium layer that contains a desired level of one or more common dopant materials (e.g., boron (B), phosphorus (P)), or the combinations thereof. It is believed that coatings that are formed from pure silicon will have a strong gettering affect for most contamination commonly found on silicon substrates that are about to have an epitaxial layer formed thereon. The use of silicon may also be beneficial to minimize the effect of particle contamination on device yield that would be caused by the metal contamination or poisoning of a subsequently formed epitaxial layer on the cleaned surface of the substrate. In one example, the gettering coating is deposited using a silane ($SiH_4$) containing gas that is delivered into the processing region of the processing chamber to a pressure of about 0.1 to about 5.0 Torr and an RF power between about 200 watts and about 2 kW, while the chamber component temperatures are maintained in a range between about 200° C. and about 500° C.

In one embodiment, a layer of a gettering material that is configured to getter oxygen may be deposited on the inner surfaces of the cleaning chamber. In one embodiment, the coating comprises a silicon (Si) layer of a thickness between about 10 Å to about 1 μm. The silicon coating may be deposited by use of a typical CVD or ALD type processes that deliver a silicon containing precursor to heated components that are positioned in the processing region of the chamber. The components that are to receive the gettering material may be heated by use of external lamps, embedded resistive heating elements, and/or are heated by use of the RF plasma.

The coating of gettering material deposited in step 216 is capable of immobilizing, absorbing or adsorbing undesired species created during the cleaning process. Eventually, the gettering capability of the coating will be reduced as the active surfaces are covered or become less reactive. To compensate for this problem a fresh coating of gettering material may be formed on the components in the processing region 122 by repeating steps 212, 214, 216. In one embodiment, steps 212, 214, 216 may be repeated prior to processing each substrate in the cleaning chamber. In another embodiment, steps 212, 214, 216 may be repeated after processing multiple substrates in the cleaning chamber.

After depositing the layer of gettering material, the shutter disk, dummy disk, or dummy substrate is removed from the cleaning chamber. Next, a substrate that is to be cleaned is disposed in the cleaning chamber. Since the cleaning chamber is generally kept in a vacuum state, contaminations and particles found on the substrate surface, such as oxygen, carbon, fluorine, silicon, and chlorine, may desorb or be moved so that they can be gettered by the coating formed on the inner surface of the cleaning chamber.

The substrate is then cleaned by performing one or more oxidation and etching steps which are discussed below. The oxidation process is used to consume contaminated or damaged silicon found on the surface of the substrate. The formed oxidized layer is then removed to expose a fresh and clean silicon surface. The oxidation process is described in step 220, and the etching step is described in step 222.

In step 220, an oxidizing agent is delivered to the cleaning chamber to generate oxide on a top layer of the substrate being cleaned. In one embodiment, the oxidizing agent comprises ozone ($O_3$), which enables oxidation of silicon at a relatively low temperature. In one embodiment, ozone may be generated in an ozonator from exposing oxygen to plasma, ultra violet (UV) energy, or the combination of plasma and UV energy. In one embodiment, UV lamps 145 are positioned to deliver energy to the surface of the substrate during processing. In one embodiment (not shown), the UV lamps are positioned so that it can deliver UV light through a port formed in one of the chamber walls 128. Detailed description of method for oxidation may be found in United States Patent Application Publication No. 2006/0223315, entitled "Thermally Oxidizing Silicon Using Ozone" and United States Patent Application Publication No. 2002/0115266, entitled "Method and a System For Sealing An Epitaxial Silicon Layer On A Substrate," which are both incorporated herein by reference.

In one embodiment, the substrate surface is oxidized using a high temperature oxidation process. In this case the substrate may be heated on a substrate support member, such as the substrate supporting member 162A of FIG. 1, to a temperature between about 400° C. to about 700° C. During oxidization, the cleaning chamber is maintained at a lower temperature than the substrate. For example, the cleaning chamber components (e.g., walls, shields), including the gas delivery paths, is maintained at a temperature less than 400° C., or substantially lower than 400° C. In one embodiment, the substrate support member/heater is maintained at about 700° C., and the cleaning chamber is maintained at about 350° C. In one embodiment, the walls are temperature controlled using fluid flowing through channels formed in the walls of the processing chamber.

In step 222, an etching process is then performed to remove the oxide formed in step 220. The etching process may be achieved by the use of physical, chemical, or a combination of physical and chemical etching techniques.

In case of chemical etching, an etching gas may be delivered into the cleaning chamber and a plasma may be ignited to generate reactive species that chemically reacts with the material on the substrate. Volatile byproducts of the reaction are removed by a vacuum system connected to the cleaning chamber and/or gettered by the coating formed on the surface of the chamber components in step 216. The etching gas may comprise chlorine, fluorine or other compounds that are suitable for the removal of the oxides formed on the substrate surface during step 220. In one embodiment, the etching gas comprises nitrogen trifluoride ($NF_3$), chlorine ion ($Cl^-$), and a carrier gas, such as argon.

A physical etching is performed by generating a plasma that provides energetic species that are used to bombard the substrate surface to physically remove the material from the substrate surface. In some cases it is desirable to provide a bias to the substrate support to accelerate ions formed in the plasma towards the substrate surface. The bombarding ions physically remove material on the substrate surface by a sputter-etching action. Low energy physical bombardment of the substrate surface is generally desirable to reduce the amount damage to the silicon lattice at the substrate surface. A low power bias may be used to remove the oxidized layer and minimize the damage to the surface of the substrate. Conventional dry etching processes are generally used to rapidly remove material without need to be concerned about the substrate material lattice damage created by plasma assisted material removal process. Conventional sputter etching techniques are generally not desirable for cleaning substrates prior to performing epitaxial deposition steps due to the high energy of the bombarding ions and/or byproducts. More particularly, the etching process of the present invention comprises adjusting the energy of the ions formed during the etching process to minimize the damage to the crystalline material exposed at the substrate surface during step 222. In one embodiment, by use of a low RF power material removal process in a chamber that has a gettering layer disposed therein the material removal process performed in step 222 will form a damage-free and clean surface on the substrate, which is important to assure a high quality epitaxial layer is formed during the subsequent deposition process step(s). In one embodiment, the RF generator 123 is adapted to deliver an average RF bias power between about 25 W and about 500 W to the conductive element disposed in the substrate support 162 to perform the etching process.

In an alternate embodiment of the method 200, step 216 is performed after step 220, but prior to performing step 222. In one aspect of this alternate embodiment, steps 220 and 222 are performed in different chambers so that the gettering layer is not deposited on the surface of the oxidized substrate (step 216) prior to performing step 222. In another aspect of the alternate embodiment, in which a single cleaning chamber is used, step 220 is performed on the substrate, then the substrate is removed from the cleaning chamber so that a dummy substrate can be inserted to allow step 216 to be performed without coating the surface of the oxidized substrate with the gettering material, and then the dummy substrate is removed and the oxidized substrate is reinserted so that step 222 can be performed.

Figure 4:
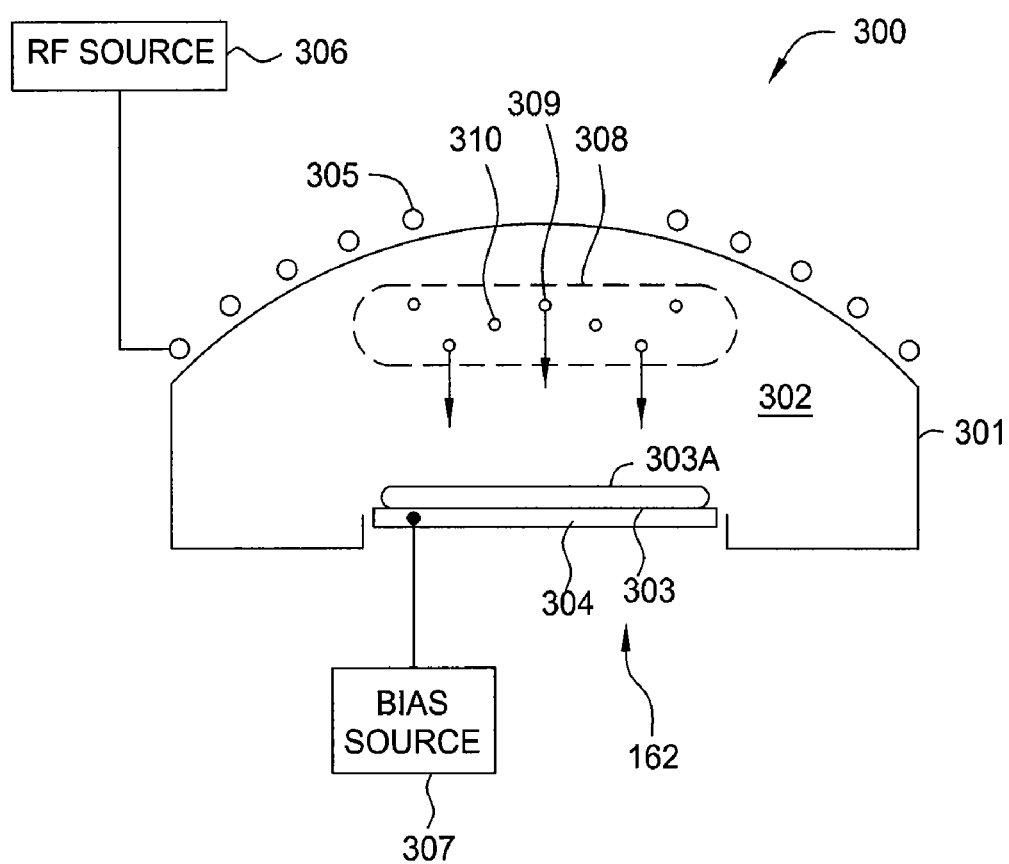
FIG. 4 schematically illustrates a partial sectional side view of a cleaning chamber.

FIG. 4 schematically illustrates a partial sectional side view of a cleaning chamber 300 that generally illustrates a mechanism that may cause the physical etching process. The cleaning chamber 300 having a chamber body 301 defining a process region 302. A substrate 303 to be cleaned may be disposed in the process region 302 on a substrate support 304. A coil 305 is positioned outside an upper portion of the chamber body 301 to generate a plasma 308 in an upper portion of the process region 302. A RF source 306 may be connected to the coil 305 to provide RF energy for plasma generation. A bias source 307 may be coupled to the substrate support 304 to provide a bias potential to the substrate 303 and/or the substrate support 304. Activated species 309 or ions 310 generated in the plasma 308 may be attracted to a top surface 303A of the substrate 303 to remove materials thereon.

In one embodiment, energy of the activated species 309 and/or ions 310 may be adjusted so that no physical damage will occur to the top surface 303A during material removal. The adjustment may be achieved by lowering the substrate RF bias power, adjusting bias potential applied across the substrate, pulsing RF power delivered to the plasma generating components (e.g., inductive coupled device (e.g., coil), capacitively coupled device (e.g., showerhead, microwave source), pulsing substrate RF bias power, forming a plasma that contains light atomic species in etching gas, using a plasma shield to confine the plasma, adjusting processing position of the substrate relative to the plasma, and/or a combination thereof.

In one embodiment, the energy of the activated species may be reduced by using a lowered RF bias power delivered to the substrate support. In one embodiment, the power of a bias source, such as the bias source 307 in FIG. 4, may be set at about 50 W for removing silicon dioxide from a top surface of the a substrate.

In one embodiment, the potential of a bias source, such as the bias source 307 in FIG. 4, may be adjusted to be less cathodic to reduce the bias on the substrate. In one embodiment, the bias source may be eliminated and the substrate is positioned on a grounded substrate support. In another embodiment, a reversed bias may be applied to apply a repelling force to ions and reactive ion species in the plasma. For example, a reversed bias may be used when cleaning a silicon-on-insulator substrate.

In one embodiment, the plasma energy may be reduced by pulsing the RF source and/or the substrate bias source. The degree of energy reduction may be controlled by adjusting duty cycle of the RF pulses delivered to the plasma generating components (e.g., coil, showerhead, microwave source). Pulsing the RF source reduces density of activated species in a plasma generated by the RF source. In one embodiment, a RF source is pulsed to maintain a low energy plasma in a cleaning chamber during a cleaning process. Pulsing the RF source reduces the overall plasma and activated species density in the plasma processing region, and therefore reduces the energy and number of bombarding species to avoid damages to the substrate. A detailed discussion on pulsed plasma processes may be found in the U.S. patent application Ser. No. 11/614,019, filed Dec. 20, 2007, entitled "Method and Apparatus for Fabricating a High Dielectric Constant Transistor Gate Using a Low Energy Plasma Apparatus," which is incorporated herein by reference.

In one embodiment, the etching gas comprises one or more lighter species that used to generate the low energy plasma to reduce or minimize any damage created on the substrate surface by physical etching processes. In one embodiment, a lighter gas species, such as helium (He), neon (Ne), hydrogen ($H_2$), or combinations thereof may be added to an etching gas that contains other process gases, such as argon (Ar). In one embodiment, the etching gas comprises argon and helium. In another embodiment, the etching gas substantially comprises argon, helium, and hydrogen gas. In another embodiment, the etching gas comprises argon and hydrogen. In another embodiment, the etching gas comprises argon and nitrogen. In yet another embodiment, the etching gas substantially comprises helium (He), neon (Ne), or hydrogen ($H_2$).

Figure 2B:
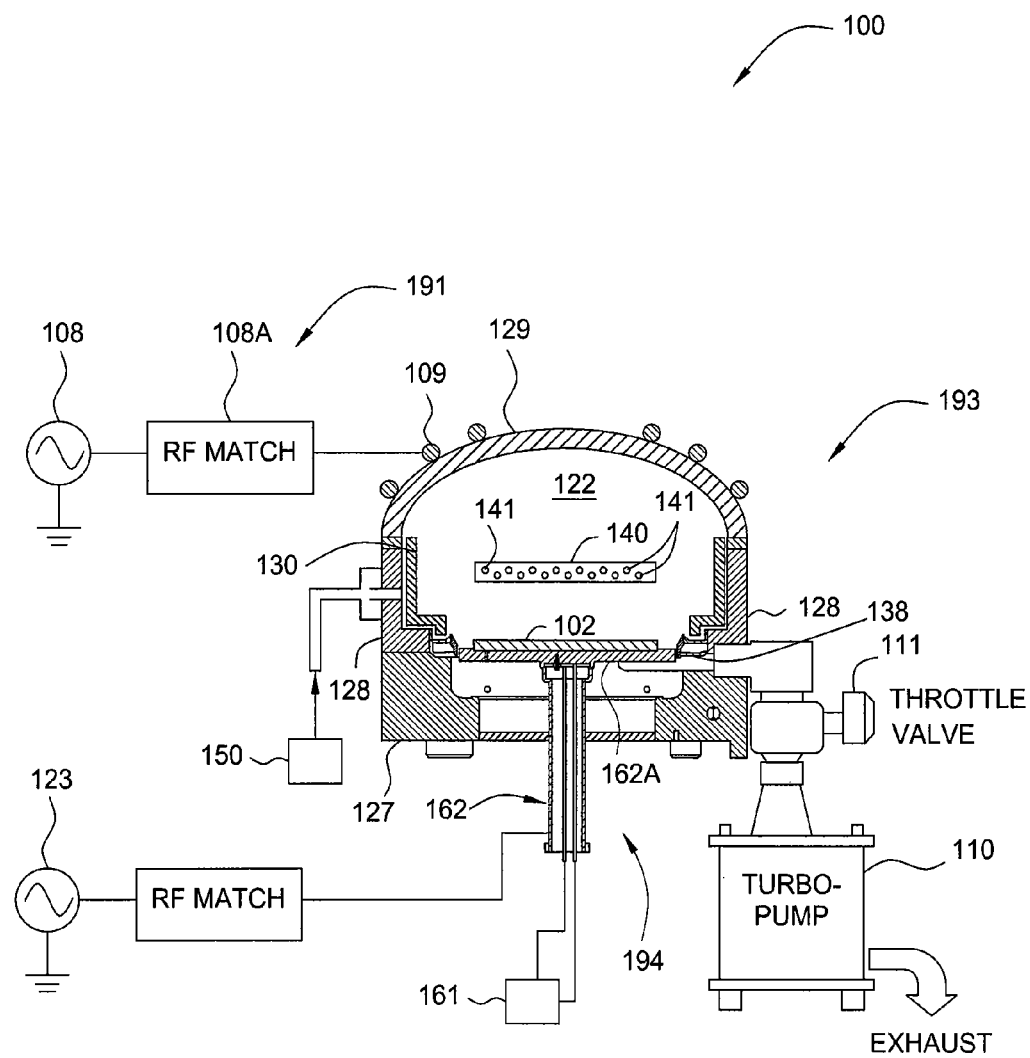
FIG. 2B schematically illustrates a sectional side view of a cleaning chamber in accordance with one embodiment of the present invention.

In another embodiment, a plasma shield 140 (FIG. 2B) may be positioned near the surface of a substrate during processing. FIG. 2B schematically illustrates a cross-sectional side view of one embodiment of the cleaning chamber 100 that contains a plasma shield 140. The plasma shield is used to reduce or minimize the amount of and/or the energy of the bombarding species near the surface of the substrate. The plasma shield 140 may be a perforated or porous material that allows portions of the plasma and/or process gases to pass through during processing. In one embodiment, the perforations are a plurality of holes 141 that pass through the plasma shield. In one embodiment, the plasma shield is made of a dielectric material, or is coated with a dielectric material, that is compatible with the plasma and process gases (e.g., quartz, $SiO_2$). In one embodiment, the plasma shield is made from the same material as other components in the chamber, such as the material from which the chamber lid 129 or chamber walls 128 are made. In one embodiment, the plasma shield is made from a material selected from a group consisting of silicon, yttrium, yttrium oxide, germanium, boron, phosphorous, and silicon germanium compounds.

In another embodiment, relative position of a substrate being processed and the plasma generated in a cleaning chamber may be adjusted to adjust amount of bombardment of the substrate surface by the ions or active species in the plasma. Similar adjustment is described in the commonly assigned United States Patent Application Publication No. 2006/0105114, entitled "Multi-Layer High Quality Gate Dielectric for Low-Temperature Poly-Silicon TFTs," which is incorporated herein by reference.

Returning back to FIG. 3, the exemplary etching process of step 222 may be performed in a cleaning chamber similar to the cleaning chamber 100 of FIG. 1 to remove silicon oxides formed on a top surface of a substrate. During processing, the chamber pressure may be maintained at about 1 mTorr to about 1 Torr. In one embodiment, the chamber pressure may be maintained at between about 20 mTorr to about 800 mTorr. An etching gas comprising helium and argon may be provided to the process region. In one embodiment, the chamber pressure may be about 5 mTorr to about 20 mTorr and the etching gas comprises primarily helium. The substrate being processed may also be heated to a temperature up to about 700° C. The cleaning chamber may be maintained at a temperature between about 20° C. to about 400° C. In one embodiment, the chamber is maintained at a temperature of about 30° C. It is believed that maintaining the chamber walls at a lower temperature may help reduce the erosion of the chamber walls.

Returning to FIG. 3, steps 220, 222 may be repeated one or more times until the substrate is cleaned. Once the substrate surface is cleaned then step 224 and/or step 226 may then be performed on the clean substrate surface.

In step 224, a passivation treatment is performed to the cleaned substrate so that the substrate remains clean until a subsequent epitaxial deposition process. In one embodiment, the passivation treatment comprises flowing a passivation gas and generating a plasma of the passivation gas. In one embodiment, the passivation gas comprises a dilute concentration of hydrogen gas ($H_2$) that is used to terminate the cleaned silicon surface with hydrogen. In one embodiment, the passivation treatment comprises delivering a hydrogen containing gas comprising about 1% of hydrogen gas while the substrate is maintained at a temperature between about 50 and about 500° C.

In step 226, an epitaxial silicon layer may be grown on the cleaned substrate in an epitaxial chamber. To grow a silicon epitaxial layer using a CVD process, a substrate is positioned in a epitaxial chamber set to an elevated temperature, for example, about 500° C. to 800° C., and a reduced pressure state or atmospheric pressure. While maintaining in the elevated temperature and reduced pressure state, a silicon containing gas, such as monosilane gas or dichlorosilane gas, is supplied to the epitaxial chamber and a silicon epitaxial layer is grown by vapor phase growth to form a semiconductor layer having the same crystalline orientation as the substrate on which it is grown. The processes may operate at a range of pressures from about 0.1 Torr to about 760 Torr. Hardware that may be used to deposit silicon-containing films includes the Epi Centura RTM system and the Poly Gen RTM system available from Applied Materials, Inc., located in Santa Clara, Calif. A detailed description of an epitaxial chamber may be found in U.S. patent application Ser. No. 11/767,619, entitled "Modular CVD EPI 300 mm Reactor," filed Jun. 25, 2007, which is incorporated herein by reference.

The method 200 may be performed in a cluster tool comprising a cleaning chamber and an epitaxial chamber. In conventional configurations, a substrate may be wait a period of time after performing a conventional cleaning process (e.g., wet clean processes) before it is it is transferred into an epitaxial deposition chamber to form an epitaxial layer. The process of waiting can affect the cleanliness of the substrate surface, which can affect the wafer to wafer process results. In one embodiment, the timing between the completion of step 224 and the subsequent epitaxial layer deposition process (i.e., step 226) is scheduled such that the substrate is transferred to the epitaxial chamber immediately after passivation process has been completed. The use of a controller 147 that controls the process timing, or scheduling, can improve the process repeatability and device yield. In one embodiment, a queuing step may be added before step 224 to eliminate waiting after passivation. In another embodiment, step 222 and/or step 224 are not started until the controller 147 is sure that the epitaxial deposition chamber will be ready to receive the substrate when step 222 and/or step 224 is completed.

In one embodiment, steps 220 is performed in a first cleaning chamber 100, and step 222 is performed in a second cleaning chamber 100 to reduce any process affect that step 220 may have step 222 or vice versa. In one embodiment, the first cleaning chamber 100 may perform steps 212-220 and the second cleaning chamber 100 may perform steps 212-216 and steps 222-224.

The controller 147 is generally designed to facilitate the control and automation of the first cleaning chamber 100 and system 400 (FIG. 5) and typically may include a central processing unit (CPU) (not shown), memory (not shown), and support circuits (or I/O) (not shown). The CPU may be one of any form of computer processors that are used in industrial settings for controlling various chamber processes and hardware (e.g., detectors, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the controller 147 determines which tasks are performable on a substrate. Preferably, the program is software readable by the controller 147, which includes code to generate and store at least process recipe sequencing, substrate positional information, the sequence of movement of the various controlled components, process control, process timing, scheduling, queuing steps, and any combination thereof.

Cluster Tool

Figure 5:
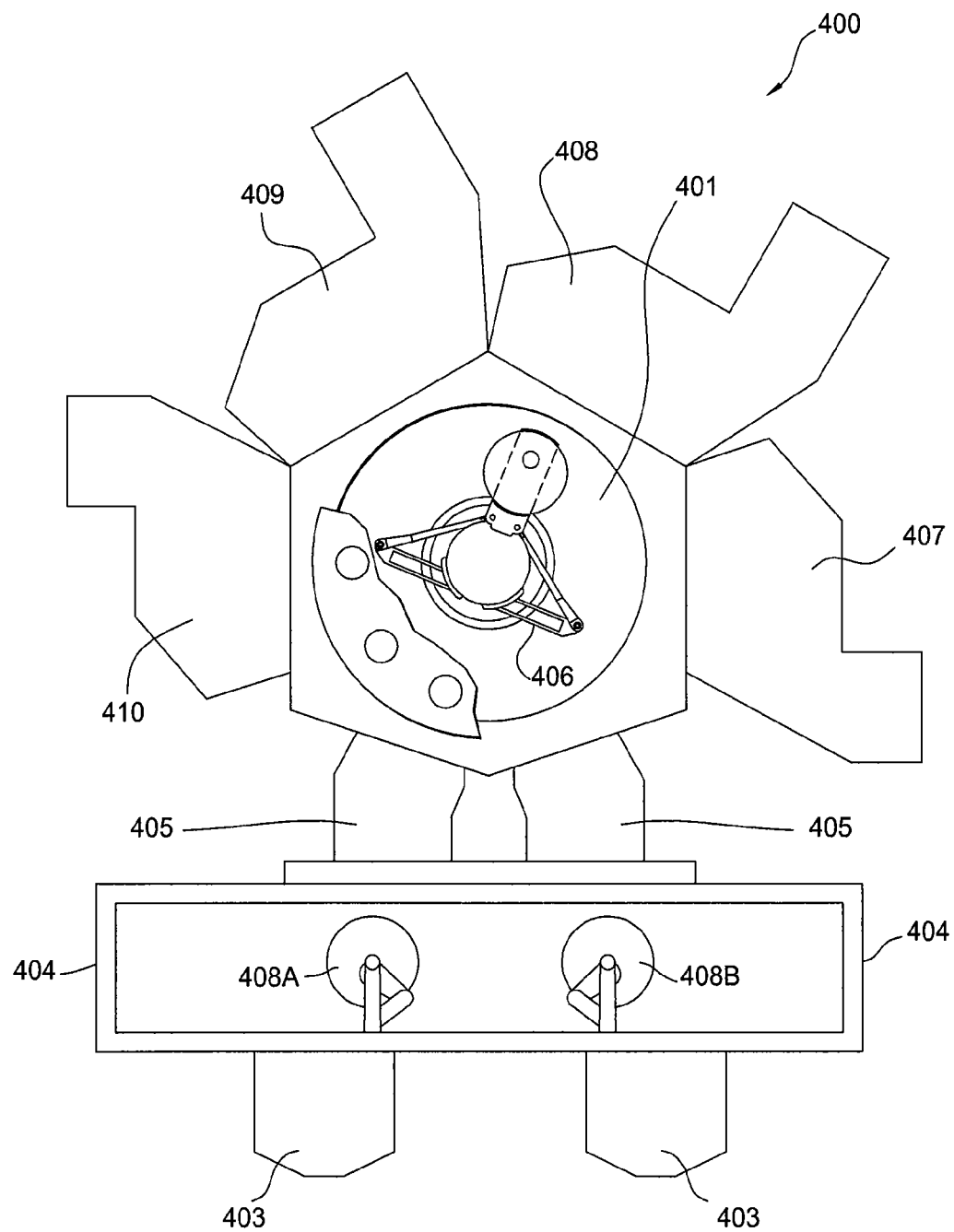
FIG. 5 schematically illustrates a plan view of a cluster tool in accordance with one embodiment of the present invention.

FIG. 5 illustrates a plan view of a cluster tool 400 for semiconductor processing in accordance with one embodiment of the present invention. A cluster tool is a modular system comprising multiple chambers which perform various functions in a semiconductor fabrication process. The cluster tool 400 comprises a central transfer chamber 401 connected to a front end environment 404 via a pair of load locks 405. Factory interface robots 408A and 408B are disposed in the front end environment 404 and are configured to shuttle substrates between the load locks 405 and a plurality of pods 403 mounted on the front end environment 404.

A plurality of chambers 407, 408, 409, and 410 are mounted to the central transfer chamber 401 for performing a desired process. A central robot 406 disposed in the central transfer chamber 401 is configured to transfer substrates between the load locks 405 and the chambers 407, 408, 409, 410, or among the chambers 407, 408, 409, 410.

In one embodiment, the cluster tool 400 comprises a cleaning chamber, such as the cleaning chamber 100 of FIG. 1, and two epitaxial chambers 407, 408. The chamber 410 may be a cleaning chamber, such as the cleaning chamber 100 described in FIG. 1. The chamber 410 is configured to clean a substrate prior to an epitaxial growth process. The chambers 407, 408 may be epitaxial chambers capable of perform an epitaxial growth process. An exemplary epitaxial chamber may be found in U.S. patent application Ser. No. 11/767,619, entitled "Modular CVD EPI 300 mm Reactor," filed Jun. 25, 2007, which is incorporated herein by reference.

The cluster tool 400 may be used to performed the method 200 described above. During processing, a substrate that is to be processed may arrive to the cluster tool 400 in a pod 403. The substrate is transferred from the pod 403 to the vacuum compatible load lock 405 by the factory interface robot 408A or 408B. The substrate is then picked by the central robot 406 in the transfer chamber 401 which is generally kept in a vacuum state. The central robot 406 then loads the substrate into the cleaning chamber 410, whose inner surface has been regenerated and coated as described in step 212, 214, 216 of the method 200. A clean process including steps 220, 222, 224 of the method 200 may be performed in the cleaning chamber 410 to the substrate. The central robot 406 then picks up the substrate from the cleaning chamber 410 and loads the substrate into the epitaxial chamber 407 or 408 whichever is available. An epitaxial layer may be grown on the cleaned substrate in the epitaxial chamber 407 or 408.

In one embodiment, the cluster tool 400 is configured such that it contains two cleaning chambers 100 (or 100a) that are positioned in the chamber 409 and chamber 410 positions (FIG. 5) and two epitaxial chambers positioned in the chamber 407 or chamber 408 positions. As noted above, in this configuration it may desirable to perform step 220 in one cleaning chamber (e.g., chamber 410) and perform steps 222 and 224 in the other cleaning chamber (e.g., chamber 409) before performing the epitaxial layer deposition step 226 in either of the epitaxial chambers 407, 408.

In another embodiment, the cluster tool comprises a plasma immersion ion implantation (P3I) chamber. For example, the chamber 409 may be a P3I chamber configured to implant one or more dopant into the epitaxial layer on the substrate. Exemplary P3I chamber may be found in U.S. Pat. No. 6,939,434, entitled "Externally Excited Torroidal Plasma Source with Magnetic Control of Ion Distribution," and U.S. Pat. No. 6,893,907, entitled "Fabrication of Silicon-on-Insulator Structure Using Plasma Immersion Ion Implantation," which are incorporated herein by reference.

While the foregoing is directed to embodiments of the present invention, other and further embodiments of the invention may be devised without departing from the basic scope thereof, and the scope thereof is determined by the claims that follow.

What is claimed:

1. A method for processing a semiconductor substrate, comprising:
    positioning a substrate in a processing region of a processing chamber;
    exposing a surface of the substrate disposed in the processing chamber to an oxygen containing gas to form a first oxygen containing layer on the surface;
    removing the substrate from the processing region;
    depositing a gettering layer on a surface of a chamber component disposed in the processing region;
    re-positioning the substrate in the processing region;
    removing at least a portion of the first oxygen containing layer to expose at least a portion of the surface of the substrate; and
    exposing the surface of the substrate to an oxygen containing gas to form a second oxygen containing layer on the surface of the substrate.

2. The method of claim 1, wherein forming the first oxygen containing layer, removing at least the portion of the first oxygen containing layer and forming the second oxygen containing layer are all performed in the processing chamber.

3. The method of claim 1, further comprising:
    removing at least a portion of the second oxygen containing layer to expose the surface of the substrate; and
    depositing an epitaxial layer on at least a portion of the exposed surface of the substrate.

4. The method of claim 3, further comprising:
    removing at least a portion of the second oxygen containing layer to expose the surface of the substrate, wherein forming the first oxygen containing layer, removing at least the portion of the first oxygen containing layer, forming the second oxygen containing layer and removing at least a portion of the second oxygen containing layer are all performed before removing the substrate from the processing chamber.

5. The method of claim 1, wherein depositing the gettering layer further comprises:
    shielding a substrate receiving region of a substrate support disposed in the processing region of the processing chamber before depositing the gettering layer.

6. The method of claim 5, wherein the gettering layer comprises a material selected from the group consisting of silicon and germanium.

7. The method of claim 1, wherein the oxygen containing gas comprises diatomic oxygen ($O_2$).

8. The method of claim 1, wherein the oxygen containing gas comprises ozone ($O_3$).

9. The method of claim 1, wherein forming the first oxygen containing layer or forming the second oxygen containing layer comprises exposing the substrate to ultra-violet (UV) light.

10. A method for processing a semiconductor substrate, comprising:
    positioning a substrate in a processing region of a processing chamber;
    exposing a surface of the substrate disposed in the processing chamber to an oxygen containing gas to form a first oxygen containing layer on the surface;
    removing the substrate from the processing region;

depositing a gettering layer on a surface of a chamber component disposed in the processing region;

re-positioning the substrate in the processing region;

removing at least a portion of the first oxygen containing layer to expose at least a portion of the surface of the substrate; and exposing the surface of the substrate to an oxygen containing gas to form a second oxygen containing layer on the surface of the substrate, wherein forming the first oxygen containing layer, removing at least the portion of the first oxygen containing layer and forming the second oxygen containing layer are all performed in the processing chamber.

11. The method of claim 10, further comprising:

removing at least a portion of the second oxygen containing layer to expose the surface of the substrate; and depositing an epitaxial layer on at least a portion of the exposed surface of the substrate.

12. The method of claim 10, wherein depositing the gettering layer further comprises:

shielding a substrate receiving region of a substrate support disposed in the processing region of the processing chamber before depositing the gettering layer.

13. The method of claim 10, wherein the oxygen containing gas comprises diatomic oxygen ($O_2$).

14. The method of claim 10, wherein the oxygen containing gas comprises ozone ($O_3$).

15. The method of claim 10, wherein forming the first oxygen containing layer or forming the second oxygen containing layer comprises exposing the substrate to ultra-violet (UV) light.

16. A method for processing a semiconductor substrate, comprising:

transferring a substrate to a substrate support disposed in a processing region of a processing chamber;

oxidizing a surface of the substrate by exposing the surface of the substrate to an oxygen containing gas to form a first oxidized layer on the substrate;

transferring the substrate out of the processing region;

depositing a gettering layer on a surface of a chamber component disposed in the processing region while shielding a surface of the substrate support;

transferring the substrate to the substrate support;

removing at least a portion of the first oxidized layer to expose at least a portion of the surface of the substrate; and re-oxidizing the exposed surface of the substrate to form a second oxidized layer on the surface of the substrate, wherein forming the first oxidized layer, removing at least the portion of the first oxidized layer and re-oxidizing the exposed surface are all performed in the processing chamber.

17. The method of claim 16, wherein forming the first oxidized layer or forming the second oxidized layer comprises exposing the substrate to ultra-violet (UV) light.

18. The method of claim 17, wherein the oxygen containing gas comprises diatomic oxygen ($O_2$).

19. The method of claim 17, wherein the oxygen containing gas comprises ozone ($O_3$).

20. The method of claim 17, further comprising:

removing at least a portion of the second oxidized layer to expose the surface of the substrate; and depositing an epitaxial layer on at least a portion of the exposed surface of the substrate.

* * * * *